United States Patent [19]

Early

[11] Patent Number: 4,939,516
[45] Date of Patent: Jul. 3, 1990

[54] CHOPPER STABILIZED DELTA-SIGMA ANALOG-TO-DIGITAL CONVERTER

[75] Inventor: Adrian B. Early, Buda, Tex.
[73] Assignee: Crystal Semiconductor, Austin, Tex.
[21] Appl. No.: 205,996
[22] Filed: Jun. 13, 1988
[51] Int. Cl.⁵ .............................................. H03M 3/02
[52] U.S. Cl. .................................. 341/143; 341/118; 330/259; 307/491
[58] Field of Search ............... 341/118, 119, 122, 143, 341/158, 166, 172; 330/9, 51, 69, 259, 303; 375/26, 29, 34; 307/490, 491

[56] References Cited

U.S. PATENT DOCUMENTS

| 4,138,649 | 2/1979 | Schaffer | 330/9 |
|---|---|---|---|
| 4,542,354 | 9/1985 | Robinton et al. | 341/118 |
| 4,560,975 | 12/1985 | Jarva | 330/9 |
| 4,590,458 | 5/1986 | Evans et al. | 330/259 |
| 4,633,223 | 12/1986 | Senderowicz | 330/9 |

OTHER PUBLICATIONS

"The Structure of Quantization Noise from Sigma-Delta Modulation", J. C. Candy & O'Connell J. Benjamin, IEEE Trans. Comm., vol. COM-29, No. 9, Sep. 1981, pp. 1316-1323.
J. Robert, G. C. Temes, F. Krummenacher, V. Valencic, P. Deval, "A Low-Voltage High-Resolution CMOS A/D Converter with Analog Compensation," IEEE 1986 Custom Integrated Circuits Conference, pp. 362-363.
K. Hsieh, P. R. Gray, D. Senderowicz, D. G. Messerschmidt, "A Low-Noise Chopper-Stabilized Differential Switched-Capacitor Filtering Technique", IEEE JOSSC, vol. SC-16, No. 6, Dec. 1981, pp. 708-715.
"Grab Distributed Sensor Data with 16-Bit Delta-Sigma ADCs", Frank Goodenaugh, Electronic Design, Apr. 14, 1988, pp. 49-56.

Primary Examiner—William M. Shoop, Jr.
Assistant Examiner—Brian K. Young
Attorney, Agent, or Firm—Gregory M. Howison

[57] ABSTRACT

A chopper stabilized analog-to-digital converter includes an analog modulator (10) and a digital filter (12). The analog modulator (10) is comprised of two integrators (20) and (22). The first integrator (20) is a chopper stabilized integrator which is comprised of a chopper stabilized differential amplifier (32) and a capacitively switched input. The amplifier (32) is operable to receive a chopping frequency $F_{CH}$ that is one-half the sampling frequency $F_S$ and synchronized thereto. The amplifier (32) is operable to modulate the noise up to the chopping frequency $F_{CH}$, which frequency is in the rejection portion of the filter response for the digital filter (12), thus rejecting 1/f noise.

19 Claims, 3 Drawing Sheets

CHOPPER STABILIZED DELTA-SIGMA ANALOG-TO-DIGITAL CONVERTER

TECHNICAL FIELD OF THE INVENTION

The present invention pertains in general to analog-to-digital converters and, more particularly, to an analog-to-digital converter using a chopper stabilized amplifier in the analog modulator portion thereof.

CROSS REFERENCE TO RELATED APPLICATION

This application is related to U.S. Pat. Application Ser. No. 180,899, filed Apr. 13, 1988, and entitled "DIGITALLY CALIBRATED DELTA-SIGMA ANALOG-TO-DIGITAL CONVERTER".

BACKGROUND OF THE INVENTION

Analog-to-digital converters have seen increased use in recent years due to the advances in digital signal processing and the increased use of digital transmission systems. Typically, analog-to-digital converters comprise circuitry for receiving an analog input signal and outputting a digital value that is proportional to the analog input signal. This digital output value can either be a parallel word or a serial digital bit string. There are many types of analog-to-digital conversion schemes such as voltage-to-frequency converters, charge redistribution, delta modulation, etc. Each of these techniques has advantages and disadvantages associated therewith.

One type of digital-to-analog converter that has seen increased use in recent years is that utilizing delta-sigma modulation wherein an analog voltage is input to a delta-sigma modulator and the output thereof filtered to remove noise. The delta-sigma modulator is of the type which converts an analog input to a digital pulse string having an average amplitude over time proportional to the analog input. One type of delta-sigma pulse modulator is described in U.S. Pat. No. 4,542,354, issued September 17, 1985 to Robinton, et al. Delta-sigma modulation provides for high accuracy and wide dynamic range as compared to earlier delta modulation techniques. The delta-sigma type modulation is sometimes referred to as an oversampled converter architecture which is immune from some of the earlier undesirable second order effects of delta modulation.

There are two key components of a delta-sigma analog-to-digital converter, the analog modulator and the digital filter. The analog modulator oversamples the analog input and produces a low resolution digital output. However, with any analog-to-digital converter, there are a number of noise sources that are inherent to any analog modulator design. In a delta-sigma modulator, there are output stage noise sources and input stage noise sources, the output noise sources normally being dominated by quantization noise and the input noise sources resulting from DC offset and 1/f noise. The quantization noise at low frequencies is relatively low with the largest portion thereof existing at higher frequencies. This higher frequency portion noise can be filtered out by a digital domain low-pass filter. However, the low frequency DC offset and 1/f noise cannot be filtered out by a low-pass filter, and, as such, this noise will be passed through the filter with the signal information. There therefore exists a need for an analog modulator that minimizes the low-frequency noise.

SUMMARY OF THE INVENTION

The present invention disclosed and claimed herein comprises a low noise analog-to-digital converter. The analog-to-digital converter includes an analog modulator which is operable to receive an analog input signal and convert it to a digital output signal having a value proportional to the analog input signal. The output is then filtered with a digital filter having a predetermined frequency response. The analog modulator has associated therewith circuitry to shift the low noise frequency up in frequency outside the pass band of the digital filter for rejection thereof.

In another aspect in the present invention, the analog modulator is of the delta-sigma type with at least one stage of amplification. The stage of amplification is chopper stabilized at a predetermined chopping frequency. This chopping frequency is synchronized with the sampling frequency of the delta-sigma modulator and digital filter such that the chopping frequency and its odd harmonics are disposed between the harmonics of the sampling frequency. This forces the harmonics of the chopping frequency within the rejection portion of the digital filter frequency response.

BRIEF DESCRIPTION OF THE DRAWINGS

For a more complete understanding of the present invention and the advantages thereof, reference is now made to the following description taken in conjunction with the accompanying Drawings in which.

Figure 1:
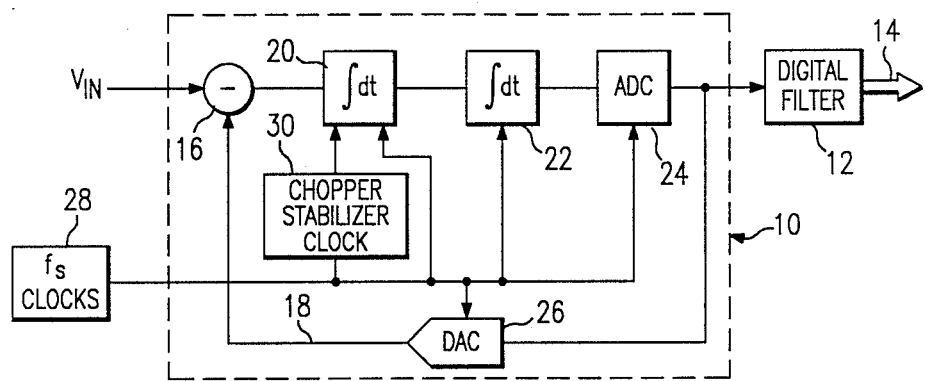
FIG. 1 illustrates a schematic block diagram of the analog-to-digital converter of the present invention.

It will be appreciated that for purposes of clarity and where deemed appropriate, that reference numerals have been repeated in the figures to indicate corresponding features.

DETAILED DESCRIPTION OF THE INVENTION

Referring now to FIG. 1, there is illustrated a block diagram of the analog-to-digital converter of the present invention. The analog-to-digital converter is comprised of a delta-sigma type analog modulator 10 which is operable to receive an analog input voltage $V_{IN}$ and convert it into an output pulse string having an average amplitude over time proportional to the analog input voltage. The output of the analog modulator 10 is input to a digital filter 12 to filter undesired signal and noise to provide a filtered output on a digital bus 14.

The analog modulator 10 has a summing junction 16 for receiving the analog input voltage $V_{IN}$ and summing it with a feedback signal on a feedback line 18. The output of the summing junction 16 is input to a first integrator 20. The first integrator 20 is a chopper stabilized integrator, as will be described in more detail hereinbelow. The first integrator 20 has the output thereof input to a second integrator 22 with the output of the second integrator input to an analog-to-digital converter (ADC) 24, the output of which provides a digital string of pulses. The output of the ADC 24 is connected to the input of a digital-to-analog converter (DAC) 26, the output of which comprises the feedback line 18. The first and second integrators 20 and 22, the ADC 24 and the DAC 26 have the clock inputs thereof connected to the output of a sample clock circuit 28 that operates at a frequency $F_S$. In addition, the sample clock circuit 28 is input to a chopper stabilized clock circuit 30 for generating a chopping clock $F_{CH}$ which operates at a frequency that, in the preferred embodiment, is one-half of the sampling clock $F_S$ generated by circuit 28. As will be described hereinbelow, the 1/f noise and DC offset errors are translated to a higher frequency by the first integrator 20 which is chopper stabilized and this noise is then filtered out by the digital filter 12.

The analog modulator 10 is operable to oversample the analog input and produce a low-resolution digital output. Typically, the ADC 24 and the DAC 26 have one bit of resolution with the ADC 24 being realized with a comparator and the DAC 26 feeding back only one of two voltages, plus or minus full-scale. With only two output levels, the DAC 26 is inherently linear. Overall modulator linearity is limited primarily by non-idealities in the first and second integrators 20 and 22.

Figure 2:
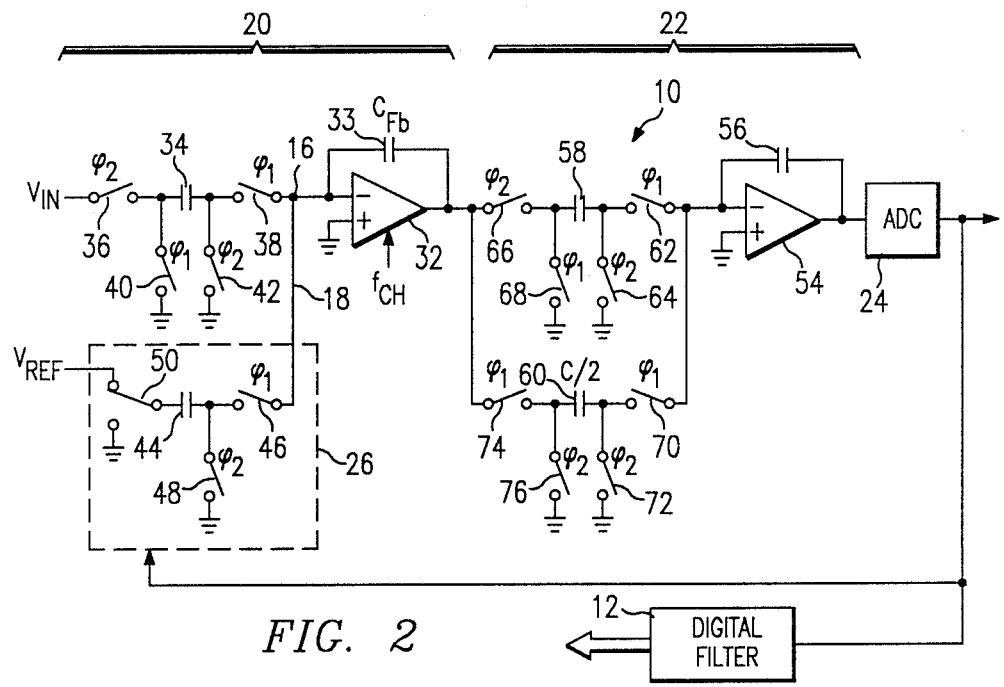
FIG. 2 illustrates a schematic block diagram of the analog modulator.

Referring now to FIG. 2, there is illustrated a detailed block diagram of the analog modulator 10 of FIG. 1. The first integrator is comprised of a chopper stabilized differential amplifier 32 having a feedback capacitor $C_{FB}$ 33 connected between the output thereof and the inverting input. The non-inverting input thereof is connected to ground. The integrator 20 also includes a sample and hold circuit comprised of a switched capacitor 34. The switched capacitor 34 has one side thereof connected to a switch 36 and the other side thereof connected to a switch 38. The switch 36 is operable to connect the input side of a capacitor 34 to the $V_{IN}$ analog input signal and the switch 38 is operable to connect the amplifier side of the capacitor 34 to the inverting input of the chopper stabilized differential amplifier 32. The input side of the capacitor 34 is connected to one side of a switch 40, switch 40 being operable to selectively connect the analog input side of the capacitor 34 to ground. The amplifier side of the capacitor 34 is connected to one side of the switch 42, the switch 42 being operable to selectively connect the amplifier side of the capacitor 34 to ground.

Switches 38 and 40 are operable to close in response to generation of a sample clock signal $\phi_1$ and switches 36 and 42 are operable to close in response to generation of a sample clock signal $\phi_2$. In operation, when $\phi_2$ is generated, switch 42 closes connecting the amplifier side of the capacitor 34 to ground and switch 36 closes connecting the analog input voltage to the analog input side of the capacitor 34. This results in sampling of the analog voltage across the capacitor 34. Thereafter, switches 36 and 42 are opened and, during $\phi_1$, switch 38 is closed and switch 40 is closed to impress the analog input voltage on the inverting input of the chopper stabilized differential amplifier 32.

The DAC 26 is comprised of a second capacitor 44 which has an amplifier side and a reference voltage side. The amplifier side is connected to one side of a switch 46, the other side of which is connected to the inverting input of the chopper stabilized differential amplifier 32 at the summing junction 16. The amplifier side of the capacitor 44 is also connected to one side of a switch 48, the other side of switch 48 connected to ground. The reference voltage side of the capacitor 44 is connected to one side of a switch 50, switch 50 operable to connect the reference voltage side of capacitor 34 to a reference voltage $V_{REF}$ or to ground, depending upon the output value of the ADC 24 and the timing state of $\phi_1$ or $\phi_2$.

Switch 48 is controlled by $\phi_2$ and switch 46 is controlled by $\phi_1$. Therefore, during sampling, the amplifier side of capacitor 44 is connected to ground and the reference voltage side of capacitor 44 is connected to either $V_{REF}$ or ground. During the hold cycle, the amplifier side of the capacitor 44 is connected to the inverting input of the chopper stabilized differential amplifier 32. Also during the hold cycle, switch 50 toggles such that the previously unconnected input (ground or $V_{REF}$) is then connected to the input side of capacitor 44. This injects either positive or negative charge into the summing junction, depending upon the starting configuration, which is in turn determined by the previous comparator output.

The second integrator 22 is comprised of a differential amplifier 54 having a feedback capacitor 56 connected between the inverting input and the output thereof. The non-inverting input is connected to ground. A sample and hold circuit is provided to perform the integrating function. The sample and hold circuit is comprised of two switched capacitors 58 and 60, capacitor 60 being one-half the value of capacitor 58 in the preferred embodiment. This smaller capacitor 60 provides a zero in the transfer function of the second integrator to improve loop stability. Capacitor 58 has the amplifier side thereof connected to one side of the switch 62, the other side of which is connected to the non-inverting input of amplifier 54. The amplifier side of capacitor 58 is also connected to one side of the switch 64 which has the other side thereof connected to ground. The input side of capacitor 58 is connected to one side of a switch 66, the other side of which is connected to the output of the chopper stabilized differential amplifier 32. The input side of the capacitor 58 is also connected to one side of a switch 68, the other side of which is connected to ground.

The capacitor 60 has the amplifier side thereof connected to one side of a switch 70, the other side of which is connected to the inverting input of the amplifier 54. The amplifier side of capacitor 60 is also connected to one side of a switch 72, the other side of which is connected to ground. The input side of capacitor 60 is connected to one side of a switch 74, the other side of which is connected to the output of the chopper stabilized differential amplifier 32. The input side of capacitor 60 is also connected to one side of a switch 76, the other side of which is connected to ground. The switches 62, 70, 68 and 74 are each controlled by the clock signals $\phi_1$. The switches 64, 66, 72 and 76 are controlled by the clock signals $\phi_2$.

The analog-to-digital converter 24 is a comparator which compares the output of the second integrator 22 with a predetermined threshold. When the output of integrator 22 exceeds this threshold, the output of ADC 24 changes, thus providing a digital string of pulses. This digital string of pulses is input to the DAC 26 and the position of switch 50 is determined by the value of the comparator input voltage at the instant of sampling. With the exception of the chopper stabilized differential amplifier 32, the operation of the circuit of FIG. 2 is that of a conventional delta-sigma modulator. However, the present invention can be realized with any type chopper stabilized analog modulator.

Chopper stabilized differential amplifiers have been utilized to enhance the low frequency noise operation of differential amplifiers. The operation of the chopper stabilized amplifiers is generally described in U.S. Pat. No. 4,138,649, issued to G. L. Shaeffer on Feb. 6, 1979. They are utilized to cancel out low frequency (1/f) noise through a pair of clock driven switches. This noise is concentrated at low frequency and arises from surface states in the channel of the MOS transistors. The magnitude of the low frequency noise component is dependent on the process used, the design of the differential amplifier used, and on the size of the input transistors used in the differential amplifier.

The chopper stabilized differential amplifier translates the noise energy from the baseband to some higher frequency so that it does not contaminate the signal at the baseband. Chopper stabilization results in modulation of the noise to odd harmonic frequencies of the chopping square wave. This results in an equivalent input noise spectrum where the 1/f noise component has been shifted to the odd harmonic frequencies of the chopping square wave. The 1/f noise density at low frequencies is equal only to the "folded back" noise from the harmonic of the 1/f noise components. Therefore, if the chopper frequency is much higher than the bandwidth of the baseband signal, the 1/f noise of the signal band would be greatly reduced by the use of chopper stabilization. Typically, in analog applications such as DC precision amplifiers, a low-pass analog filter is utilized on the output to filter the chopper stabilized amplifier. Therefore, it is not important what the chopping frequency is, but, rather only that it is outside of the pass band for the signal.

In the present invention, as will be described in more detail hereinbelow, the chopper frequency $F_{CH}$ is set at $F_S/2$ such that the noise is modulated to $F_S/2$, $3 F_S/2$, $5 F_S/2$, ..., etc. Since the digital filter 12 will be centered around the signal at the sampling frequency, the odd harmonics are outside of the pass band of the filter. It is important to note that the chopper stabilized frequency $F_{CH}$ is synchronized with respect to the sampling frequency $F_S$, and, as such, one can select the chopping frequency to be at a predetermined position in the rejection portion of the filter frequency response.

Figure 3:
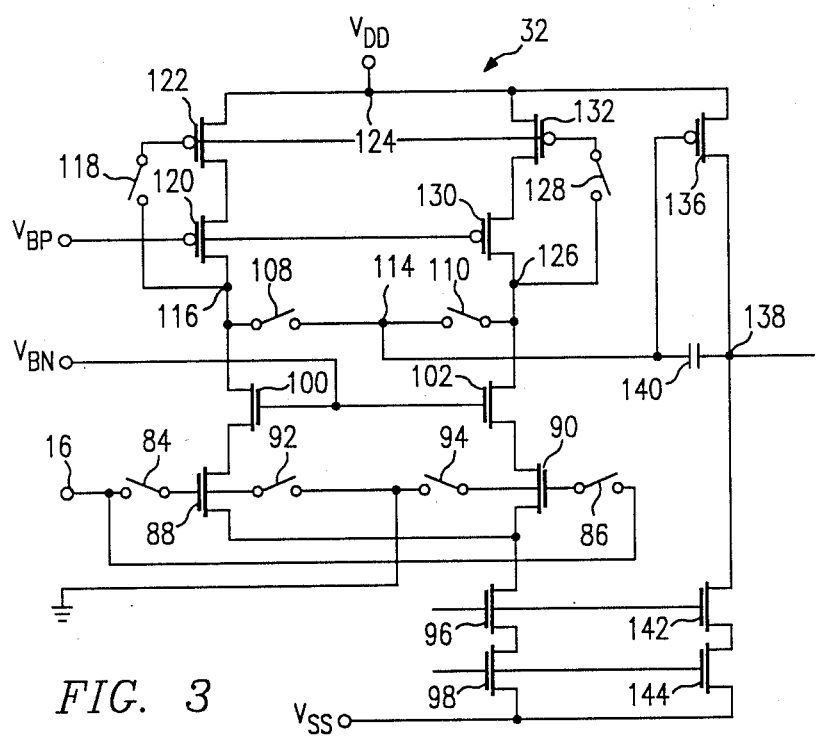
FIG. 3 illustrates a schematic diagram of the chopper stabilized differential amplifier.

Referring now to FIG. 3, there is illustrated a schematic diagram of the chopper stabilized differential amplifier 32. The inverting input, also called the summing junction 16, is connected to one side of a switch 84 and also to one side of a switch 86. The other side of the switch 84 is connected to the gate of an N-channel transistor 88 and the other side of switch 86 is connected to the gate of an N-channel transistor 90. N-channel transistors 88 and 90 comprise a differential pair. The non-inverting input of the amplifier 32 is connected to one side of a switch 92 and also to one side of a switch 94. The other side of switch 92 is connected to the gate of transistor 88 and the other side of switch 94 is connected to the gate of switch 90. The sources of transistors 88 and 90 are connected to the drain of an N-channel transistor 96, the source of which is connected to the drain of an N-channel transistor 98. The source of transistor 90 is connected to ground. The gates of transistors 96 and 98 are connected to bias circuitry (not shown) such that the drain of transistor 96 provides a current reference to bias the differential pair 88 and 90.

The drain of transistor 88 is connected to the source of an N-channel cascoding transistor 100 and the drain of transistor 94 is connected to the source of an N-channel cascoding transistor 102. The gates of transistors 100 and 102 are connected to the biasing node $V_{BN}$.

The drain of transistor 100 is connected to one side of a switch 108 and the drain of transistor 102 is connected to one side of a switch 110. The other side of switches 108 and 110 are connected to a node 114 which comprises the output of the first stage of amplification in the differential amplifier 32. The drain of transistor 100 is also connected to a node 116, which node 116 is connected to one side of a switch 118 and also to the drain of the P-channel transistor 120. P-channel transistor 120 is connected in a cascode configuration with a P-channel transistor 122. P-channel transistor 122 has the gate thereof connected to the other side of switch 118 and the source thereof connected to a power supply rail 124 labelled $V_{DD}$.

The drain of transistor 102 is connected to a node 126, which node 126 is also connected to one side of a switch 128. Node 126 is also connected to the drain of the P-channel transistor 130, the source of which is connected in a cascode configuration with a P-channel transistor 132. P-channel transistor 132 has the gate thereof connected to the other side of switch 128 and to the gate of transistor 122. The source of transistor 132 is connected to the $V_{DD}$ rail 124. Transistors 120 and 130 have the gates thereof tied together and to a bias voltage $V_{BP}$.

The output node 114 is connected to the gate of a P-channel transistor 136. The source of transistor 136 is connected to the power supply rail 124 and the drain thereof is connected to an output node 138. Output node 138 comprises the output of the chopper stabilized differential amplifier 32. Node 138 is also connected through a compensation capacitor 140 to the output node 114 from the first stage. Node 138 is also connected through two series connected N-channel transistors 142 and 144 in a cascode configuration to $V_{SS}$. The gates of transistors 142 and 144 are connected to the gates of transistors 96 and 98, respectively, and transistors 142 and 144 provide a current source function. Transistors 136, 142 and 144 therefore provide an output stage of amplification for the chopper stabilized differential amplifier 32.

In operation, switches 84, 94, 110 and 118 are controlled by the chopping clock $F_{CH}$ and switches 92, 86, 108 and 128 are controlled by the inverted form of the chopping clock $F_{CH}$. Therefore, in one mode, switch 84 is closed such that transistor 88 is connected to the inverting input of the differential amplifier 32 and switch 94 is closed to connect the gate of transistor 90 to the non-inverting input thereof. Switch 110 is closed and switch 128 is open such that the output is driven from the drains of transistors 130 and 102. When the chopping clock $F_{CH}$ changes states, the input and output are switched. This provides the chopper stabilization function described in U.S. Pat. No. 4,138,649 and effectively modulates the noise to the chopping frequency $F_{CH}$. The differential amplifier 54 is identical to the chopper stabilized differential amplifier 32 illustrated in FIG. 3 with the exception that the switches are not clocked; rather, they are placed in a predetermined position.

In operation, the chopper stabilized differential amplifier 32 of FIG. 3 has the switches thereof set in one state in response to $F_{CH}$ being in either a high or a low state. These internal switches in the chopper stabilized differential amplifier 32 are not switched until the input signal has been sampled at the clock rate of $F_S$ and the amplifier 32 allowed to settle. Therefore, in addition to having the frequencies synchronized, the timing is such that any change in the state of the internal switches in the amplifier 32 occurs after sampling to insure that the amplifier 32 has settled after any operation of the switches in the switched capacitor circuit on the input of the amplifier 32.

Figure 4:
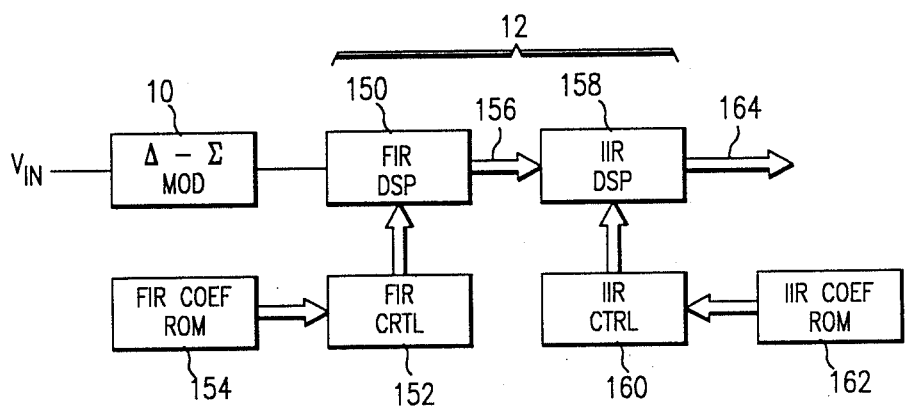
FIG. 4 illustrates a block diagram of the digital filter.

Referring now to FIG. 4, there is illustrated a block diagram of the filter function for the digital filter 12 on the output of the analog modulator 10. The filter is comprised of a finite impulse response (FIR) filter and an infinite impulse response (IIR) filter. The FIR filter is realized with an FIR digital processor (DSP) 150 which is operable to be interfaced with a FIR controller 152 that controls the operation of the FIR DSP 150 in accordance with FIR coefficients stored in a ROM 154. In the preferred embodiment, the ROM 154 is realized with a programmable logic array.

The FIR DSP 150 is essentially an arithmetic logic unit (ALU), which has the input thereof multiplexed to perform the calculations necessary to realize the filter function. Typically, digital filters are comprised of a series of multiplication and addition/subtraction steps which must be executed in a predetermined order, which order is sequential. Therefore, the serial data stream from the modulator 10 is processed through the FIR DSP 150 in accordance with the co-efficients stored in the ROM 154. This provides an output on a bus 156 which is seven-bits wide and operating at a four kHz rate, as compared to a sampling rate of sixteen kHz for the analog modulator 10 in the preferred embodiment. The FIR filter DSP 150 under the control of the FIR controller 152 therefore provides decimation of the output of the analog modulator 10 from the sixteen kHz rate to the four kHz rate. The operation of the filter is described in U.S. patent application, Ser. No. 180,889, filed Apr. 13, 1988 and entitled "DIGITALLY CALIBRATED DELTA-SIGMA ANALOG-TO-DIGITAL CONVERTER", which is incorporated herein by reference.

The IIR portion of the filter is realized with an IIR DSP 158 which is interfaced with an IIR controller 160. The IIR controller 160 controls the IIR DSP 158 in accordance with IIR coefficients stored in a ROM 162. The IIR DSP 158 is essentially an arithmetic logic unit that has the inputs thereof multiplexed to provide a sequence of multiplication and addition/subtraction operations in accordance with the IIR algorithm. This is very similar to the FIR DSP 150. The final filtered digital values are output on a bus 164.

Figure 5A:
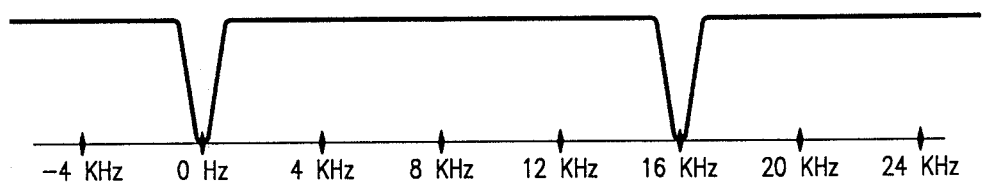
FIGS. 5a–5e illustrate the frequency response of various portions of the digital filter and the overall digital filter output response.
Figure 5B:
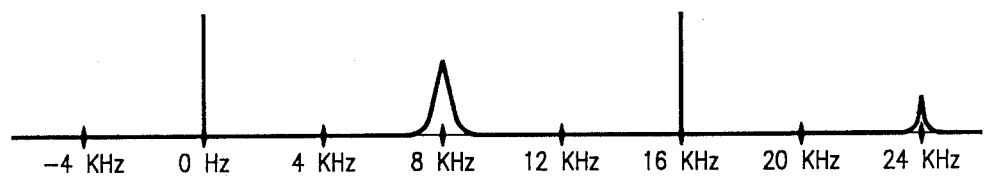

Referring now to FIG. 5a–5e, there are illustrated frequency response curves for the various filtered waveforms for both noise and signal. FIG. 5a illustrates the noise shaped quantization noise. The quantization noise at the lower frequencies is lower since there is more low frequency gain from the integrators in the feedback loop. Therefore, there is a null in the quantization noise at 0 Hz, 16 kHz and all harmonics of the sampling rate. However, the 1/f noise is still present. As described above, the chopping frequency $F_{CH}$ is 8 kHz. Therefore, the 1/f noise is centered around all odd harmonics of the chopping frequency $F_{CH}$. It can be seen therefore that the chopping noise is distributed around 8 kHz, 24 kHz, 40 kHz, etc. The 1/f noise after chopping is not present at the 0 Hz and 16 kHz harmonics.

Figure 5C:
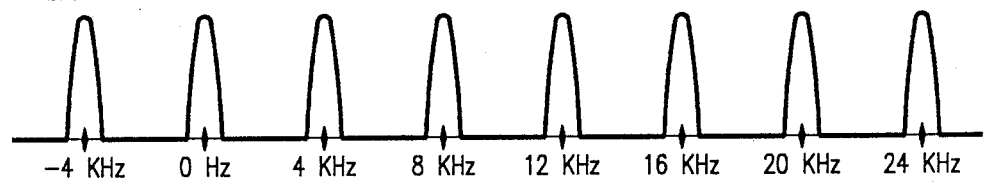
Figure 5D:
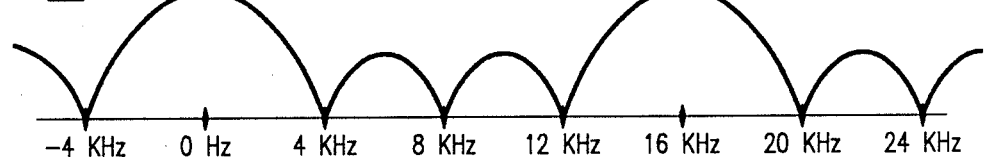

Referring now to FIG. 5c, there is illustrated a frequency response curve for the IIR portion of the filter. The IIR filter has a filter response that provides periodically repeating pass bands occurring at a 4 kHz rate with a $+/-10$ Hz bandwidth. Therefore, all harmonics of the 4 kHz rate will be passed through the IIR filter.

Referring now to FIG. 5c, there is illustrated a frequency response curve for the FIR filter. It has third order zeros at 4 kHz, 8 kHz and 12 kHz, as well as translations of these frequencies by $nf_S$, where n is an integer.

The transfer function in the z domain is:

$$\frac{y(z)}{x(z)} = 1 + 3z^{-1} + 6z^{-2} + 10z^{-3} + 12z^{-4} + 12z^{-5} + 10z^{-6} + 6z^{-7} + 3z^{-8} + z^{-9}$$

This is equivalent to the convolution of three averaging filters:

$$(1+z^{-1}+z^{-2}+z^{-3})^3$$

This results in a FIR frequency response:

$$\frac{y}{v}(f) = \frac{\left(\sin \frac{N\pi f}{f_s}\right)^n}{\left(\frac{\pi f}{f_s}\right)^N}$$

where:
N=4
n=3
$f_s$=16 kHz for normal operation.

Figure 5E:
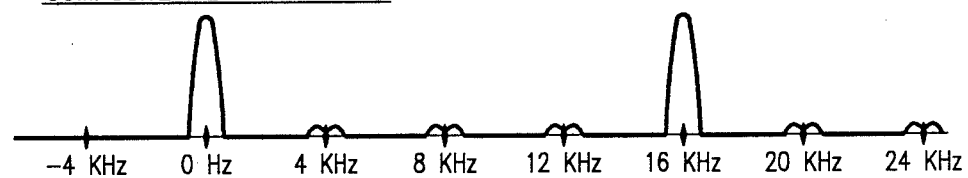

After processing the output of the FIR filter through the IIR filter as illustrated in FIG. 5c, the result is as illustrated in FIG. 5e wherein primarily signals in the $+/-10$ Hz bandwidth at $\phi$ kHz, 16 kHz and all harmonics of 16 kHz is passed through. It should be noted that the zeroes of the FIR filter response are placed at 4 kHz, 8 kHz and 12 kHz, thus rejecting most noise which would be passed through the IIR filter. In addition, the zeroes are placed at the chopping frequency $F_{CH}$ such that maximum rejection is realized at the odd harmonics of the chopping frequency. This is an important aspect of the present invention in that the FIR filter response now provides a rejection of the 1/f noise that was modulated to the chopping frequency $F_{CH}$ by the chopper stabilized differential amplifier 32 in the analog modulator 10. This was due to the result of synchronizing the chopping frequency $F_{CH}$ with the sampling frequency $F_S$. If the chopping frequency $F_{CH}$ had occurred at 16 kHz, this would result in passing through of the 1/f noise and no benefit would be realized. However, it is only necessary that the 1/f noise be modulated to a frequency that is out of band in the FIR frequency response. Since the large portion of the power density of the 1/f noise resides in the first and second harmonics, overlapping of higher harmonics of the noise with the higher harmonics of the 16 kHz sampling frequency would not be as detrimental as overlapping of the first and second harmonics of the modulated 1/f noise.

In summary, there has been provided an analog-to-digital converter utilizing a chopper stabilized analog modulator. The analog modulator includes first and second integrators of which the first integrator includes a chopper stabilized differential amplifier having a switched capacitor input. The chopping frequency of the chopper stabilized differential amplifier is synchronized with the sampling frequency of the modulator such that the modulated 1/f noise is disposed outside of the pass band of the digital filter.

Although the preferred embodiment has been described in detail, it should be understood that various changes, substitutions and alterations can be made therein without departing from the spirit and scope of the invention as defined by the appended claims.

What is claimed is:

1. An analog-to-digital converter, comprising:
   a delta sigma analog modulator operating at a predetermined sampling frequency for receiving an analog input signal, and converting the received analog input signal to a digital output signal which is representative of the analog input signal, said analog modulator having undesirable low frequency noise associated therewith, said analog modulator including at least one stage of amplification;
   a digital filter for receiving the digital output of said analog modulator and having a predetermined frequency response and sampling rate for providing a predetermined amount of attenuation over a predetermined frequency range to reject unwanted signal; and
   means for transposing the low frequency noise in the analog modulator to said predetermined frequency range.

2. The analog-to-digital converter of claim 1 wherein said means for transposing low-frequency noise is synchronized to said sampling rate of said filter such that transposed noise is in said predetermined frequency range to reject unwanted signals.

3. The analog-to-digital converter of claim 2 wherein said digital filter is synchronized with the sampling frequency of said modulator.

4. The analog-to-digital converter of claim 1 wherein said analog modulator is operable to convert said analog input signal to a digital pulse stream, said digital pulse stream having a ones density proportional to the input signal.

5. The analog-to-digital converter of claim 1 wherein said means for transposing comprises means for chopper stabilizing said one stage of amplification at a predetermined chopping frequency, such that said low frequency noise is shifted up in frequency by said chopping frequency and the harmonics thereof, and the energy of said low frequency noise disposed about the harmonics of said chopping frequency.

6. The analog-to-digital converter of claim 5 wherein said chopping frequency is synchronous with said digital filter such that said frequency shifted low frequency noise energy resides in one or more high attenuation regions of said digital filter, due to the periodic nature of said filter.

7. The analog-to-digital converter of claim 6 wherein said harmonics of said chopping frequency are odd.

8. An analog-to-digital converter, comprising:
   a delta-sigma modulator for receiving an analog input signal and converting the received analog input signal to a digital signal output that has a value proportional to the analog input signal, said delta sigma modulator operating at a predetermined sampling frequency;
   a digital filter for receiving the digital signal output of said modulator and having a predetermined frequency response for providing a predetermined amount of rejection over a defined frequency range of rejection to reject unwanted signals; and
   said delta-sigma modulator having at least one stage of amplification, said one stage of amplification having low frequency noise associated therewith and being chopper stabilized at a predetermined chopping frequency such that the energy in the low frequency noise is transposed upward in frequency by said chopping frequency and the harmonics thereof, with the harmonics of said chopping frequency being within the defined frequency range of rejection of said digital filter.

9. The analog-to-digital converter of claim 8 wherein said delta-sigma modulator includes at least one stage of integration that includes said one stage of amplification.

10. The analog-to-digital converter of claim 9 wherein said delta-sigma modulator comprises sample and hold circuitry operating at the sampling frequency for sampling signals onto the input of said one stage of integration in accordance with the operation of said delta-sigma modulator, said chopping frequency synchronized with said sampling frequency to operate said chopper stabilization of said one stage of amplification at a known temporal point in time in the operation of said sample and hold circuitry, said temporal point assuring no interaction between the sample and hold operation and the chopper stabilizing operation.

11. The analog-to-digital converter of claim 8 wherein said chopping frequency is synchronized with said sampling frequency, the harmonics of said chopping frequency being disposed in a predetermined relationship with the harmonics of said sampling frequency such that the harmonics of said chopping frequency occur within the defined frequency range of rejection of said frequency response.

12. The analog-to-digital converter of claim 11 wherein said digital filter is periodic and has frequency ranges of rejection occurring at a periodic rate with the odd harmonics of the chopping frequency disposed within said frequency ranges of rejection.

13. The analog-digital converter of claim 11 wherein said chopping frequency is lower than said sampling frequency.

14. A method for converting an analog input signal to a digital signal, comprising:
   passing the analog input signal through an oversampled analog modulator operating at a predetermined sampling frequency to convert the analog input signal to a digital output signal proportional to the analog input signal;
   filtering in the digital domain the digital output signal of the analog modulator to provide a predetermined amount of attenuation over a predetermined frequency range to reject unwanted signals; and
   transposing the energy of low frequency noise energy generated by the analog modulator proximate to a frequency within the predetermined frequency range to reject unwanted frequencies.

15. The method of claim 14 wherein the analog modulator comprises at least one step of amplification operating in accordance with the operation of the analog modulator, wherein the step of transposing low frequency noise energy comprises chopper stabilizing the one step of amplification to transpose the low frequency noise up in frequency about the harmonics of a chopping frequency, the harmonics of the chopping frequency being disposed within the predetermined frequency range to reject unwanted frequencies.

16. The method of claim 15 wherein the analog modulator includes at least one step of integration which one step of integration includes the one step of amplification.

17. A method for converting an analog input signal to a digital signal, comprising:
   passing the analog input signal through an analog modulator operating at a predetermined sampling frequency to convert the analog input signal to a digital output signal proportional to the analog input signal, the analog modulators having at least one stage of amplification;
   filtering in the digital domain the digital output signal of the analog modulator to provide a predetermined amount of attenuation over a predetermined frequency range to reject unwanted signals;
   chopper stabilizing the one stage of amplification to transpose the low frequency noise up in frequency such that the low frequency noise is disposed about the harmonics of a chopping frequency, the harmonics of the chopping frequency being disposed within the predetermined frequency range to reject unwanted frequencies; and
   synchronizing the chopping frequency with the sampling frequency of the analog modulator, such that the harmonics of the chopping frequency are disposed at a predetermined relationship with respect to the harmonics of the sampling frequency.

18. The method of claim 17 wherein the step of filtering comprises passing the digital output signal through a digital filter, the frequency response of the digital filter rejecting unwanted frequencies in the predetermined frequency range which comprises a high rejection portion of the frequency response, the step of synchronizing disposing the harmonics of the chopping frequency within the high rejection portion of the frequency response.

19. The method of claim 17 wherein the analog modulator includes at least one stage of integration, which one stage of integration includes the one stage of amplification.

* * * * *

REEXAMINATION CERTIFICATE (2116th)
United States Patent [19]
Early

[11] B1 4,939,516

[45] Certificate Issued Oct. 26, 1993

[54] CHOPPER STABILIZED DELTA-SIGMA ANALOG-TO-DIGITAL CONVERTER

[75] Inventor: Adrian B. Early, Buda, Tex.

[73] Assignee: Crystal Semiconductor Corporation, Austin, Tex.

Reexamination Request:
No. 90/002,884, Nov. 10, 1992

Reexamination Certificate for:
Patent No.: 4,939,516
Issued: Jul. 3, 1990
Appl. No.: 205,996
Filed: Jun. 13, 1988

[51] Int. Cl.[5] .......................................... H03M 3/02
[52] U.S. Cl. .................................... 341/143; 341/118; 330/259; 307/491; 375/28; 375/34
[58] Field of Search ............. 341/118, 122, 143, 158, 341/166, 172; 375/26, 29, 30, 34

[56] References Cited

U.S. PATENT DOCUMENTS

| | | | |
|---|---|---|---|
| Re. 31,720 | 10/1984 | DeFreitas et al. | 375/30 |
| Re. 31,976 | 8/1985 | DeFreitas | 332/11 |
| 4,190,801 | 2/1980 | DeFreitas | 375/30 |
| 4,254,502 | 3/1981 | DeFreitas et al. | 375/30 |
| 4,305,050 | 12/1981 | DeFreitas | 332/11 |
| 4,462,106 | 7/1984 | DeFreitas et al. | 375/30 |
| 4,612,654 | 9/1986 | DeFreitas | 375/30 |
| 4,746,899 | 5/1988 | Swanson et al. | 340/347 |
| 4,772,871 | 9/1988 | Suzuki et al. | 341/155 |
| 4,851,841 | 7/1989 | Sooch | 341/143 |
| 4,918,454 | 4/1990 | Early et al. | 341/172 |
| 4,943,807 | 7/1990 | Early et al. | 341/120 |
| 4,994,805 | 2/1991 | Dedic et al. | 341/143 |

FOREIGN PATENT DOCUMENTS 63-94718  4/2588  Japan.

OTHER PUBLICATIONS

Michael C. W. Coln, "Chopper Stabilization of MOS Operational Amplifiers," *IEEE Journal of Solid-State Circuits*, vol. SC-16, No. 6, Dec. 1981, IEEE, New York, N.Y., pp. 745-748.

Enz et al., "A CMOS Chopper Amplifier," *IEEE Journal of Solid-State Circuits*, vol. SC-22, No. 3, Jun. 1987, IEEE, New York, N.Y., pp. 335-342.

M. Hauser et al., "Circuit and Technology Considerations for MOS Delta-Sigma A/D Converters," 1986 IEEE International Symposium on Circuits and Systems, IEEE, New York, N.Y., pp. 1310-1315.

Rinaldo Castello and Paul R. Gray, "Performance Limitations in Switched Capacitor Filters," IEEE Transactions on Circuits and Systems, vol. CAS-32, No. 9, ISSN 0098-4094 (Sep. 1985), IEEE, New York, N.Y., pp. 865-876.

Gregory L. Schaffer, "A CMOS A/D Converter Circuit for Thermocouple Temperature Measurement," IEEE International Solid State Circuits Conference, vol. XXIV, Feb. 1981, IEEE, New York, N.Y., pp. 60-61.

Plasche & Grift, "A Five-Digit Analog-Digital Converter," IEEE Journal of Solid State Circuits, vol. SC-12, No. 6 (Dec. 1977), IEEE, New York, N.Y., pp. 656-662.

James C. Candy, "A Use of Limit Cycle Oscillations to Obtain Robust Analog-to-Digital Converters," IEEE Transactions on Communications, vol. com-22, No. 3, Mar. 1974, IEEE, New York, N.Y., pp. 298-305.

Max W. Hauser, Paul J. Hurst, and Robert W. Brodersen, "MOS ADC-Filter Combination That Does Not Require Precision Analog Components," 1985 IEEE International Solid State Circuits Conference, IEEE, New York, N.Y., pp. 80-81 and 813.

David A. Allstot and William C. Black, Jr., "Technological Design Considerations for Monolithic MOS Switched-Capacitor Filter Systems," Proceedings of the IEEE, vol. 71, No. 8 (Aug. 1983), IEEE, New York, New York, pp. 967-986.

P. J. A. Naus & E. C. Dijkmans, "Low Signal-Level Distortion in Sigma-Delta Modulators," 84th Convention, Paris, Mar. 1-4, 1988, Audio Eng. Society Preprint No. 2584(D-4), Audio Eng. Society, New York, N.Y., pp. 1-14.

Y. Matsuya et al., "A 16-bit Oversampling A-to-D Conversion Technology Using Triple-Integration Noise Shaping," IEEE Journal of Solid-State Circuits,

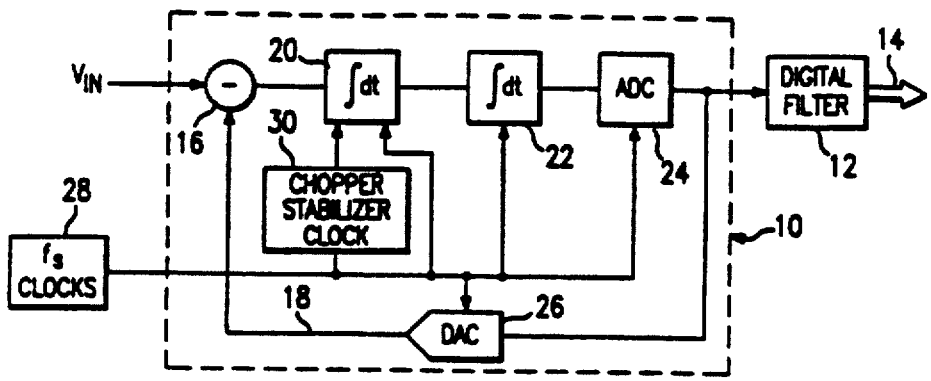

vol. SC-22, No. 6, Dec. 1987, IEEE, New York, N.Y., pp. 921–929.

Peter J. Naus et al., "A CMOS Stereo 16-bit D/A Converter for Digital Audio," IEEE Journal of Solid-State Circuits, vol. SC-22, No. 3 (Jun. 1987), IEEE, New York, N.Y., pp. 390–395.

James C. Candy, "Decimation for Sigma Delta Modulation," IEEE Transactions on Communications, vol. COM-34, No. 1 (Jan. 1986), IEEE, New York, N.Y., pp. 72–76.

James C. Candy, "A Use of Double Integration in Sigma Delta Modulation," IEEE Transactions on Communications, vol. Com-33, No. 3 (Mar. 1985) IEEE, New York, N.Y., pp. 249–258.

Robert W. Adams, "Design and Implementation of an Audio 18-Bit Analog-to-Digital Converter Using Oversampling Techniques," J. Audio Eng. Society, vol. 34, No. 3 (Mar. 1986), Audio Eng. Society, New York, N.Y., pp. 153–166.

W. L. Lee and Charles G. Sodini, "A Topology for Higher Order Interpolative Coders," ISCAS, IEEE No. CH2394-5/87/0000-0459 (1987) IEEE, New York, N.Y., pp. 459–462.

J. D. Everard, "A Single Channel Codec," ICC 78 International Conference on Communication, Toronto, Canada (Jun. 4–7, 1978), pp. 45.3.1 to 45.3.5.

*Primary Examiner*—Brian K. Young

[57] ABSTRACT

A chopper stabilized analog-to-digital converter includes an analog modulator (10) and a digital filter (12). The analog modulator (10) is comprised of two integrators (20) and (22). The first integrator (20) is a chopper stabilized integrator which is comprised of a chopper stabilized differential amplifier (32) and a capacitively switched input. The amplifier (32) is operable to receive a chopping frequency $F_{CH}$ that is one-half the sampling frequency $F_S$ and synchronized thereto. The amplifier (32) is operable to modulate the noise up to the chopping frequency $F_{CH}$, which frequency is in the rejection portion of the filter response for the digital filter (12), thus rejecting 1/f noise.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–19 is confirmed.

New claims 20–36 are added and determined to be patentable.

20. *The analog-to-digital converter as claimed in claim 1, wherein said means for transposing comprises means for chopper stabilizing said one stage of amplification at a predetermined chopping frequency, such that said low-frequency noise is shifted up in frequency by said chopping frequency and harmonics thereof, the energy of said low-frequency noise is disposed about the harmonics of said chopping frequency, and said chopping frequency is one-half of said sampling frequency.*

21. *The analog-to-digital converter as claimed in claim 1, wherein:*

*said means for transposing comprises means for chopper stabilizing said one stage of amplification at a predetermined chopping frequency, such that said low-frequency noise is shifted up in frequency by said chopping frequency and harmonics thereof, and the energy of said low-frequency noise is disposed about the harmonics of said chopping frequency;*

*said one stage of amplification has an amplifier stage input and an amplifier stage output, and said one stage of amplification includes a differential amplifier having a pair of differential inputs and a pair of differential outputs; and*

*said means for chopper stabilizing includes a first electronic switching means operable periodically at said chopping frequency for alternately connecting a first one of said differential inputs to said amplifier stage input during a first half-cycle at said chopping frequency and connecting a second one of said differential inputs to said amplifier stage input during a second half-cycle at said chopping frequency, and a second electronic switching means operable periodically at said chopping frequency for alternately connecting a first one of said differential outputs to said amplifier stage output during said first half-cycle at said chopping frequency and connecting a second one of said differential outputs to said amplifier stage output during said second half-cycle at said chopping frequency.*

22. *The analog-to-digital converter as claimed in claim 1, wherein:*

*said means for transposing comprises means for chopper stabilizing said one stage of amplification at a predetermined chopping frequency, such that said low frequency noise is shifted up in frequency by said chopping frequency and harmonics thereof, and the energy of said low-frequency noise is disposed about the harmonics of said chopping frequency;*

*said one stage of amplification has an amplifier stage input and an amplifier stage output, and said one stage of amplification includes a differential amplifier having a pair of differential inputs and a pair of differential outputs;*

*said means for chopper stabilizing includes a first electronic switch connected between said amplifier stage input and a first one of said differential inputs, and a second electronic switch connected between said amplifier stage input and a second one of said differential inputs, such that said first electronic switch and said second electronic switch are operable periodically at said chopping frequency for alternately closing a first signal path from said first one of said differential inputs to said amplifier stage input during a first half-cycle at said chopping frequency and closing a second signal path from said second one of said differential inputs to said amplifier stage input during a second half-cycle at said chopping frequency; and*

*said means for chopper stabilizing includes a third electronic switch connected between said amplifier stage output and a first one of said differential outputs, and a fourth electronic switch connected between said amplifier stage output and a second one of said differential outputs, such that said third electronic switch and said fourth electronic switch are operable periodically at said chopping frequency for alternately closing a third signal path from said first one of said differential outputs to said amplifier stage output during said first half-cycle at said chopping frequency and closing a fourth signal path from said second one of said differential outputs to said amplifier stage output during said second half-cycle at said chopping frequency.*

23. *The analog-to-digital converter as claimed in claim 1, wherein:*

*said means for transposing comprises means for chopper stabilizing said one stage of amplification at a predetermined chopping frequency, such that said low-frequency noise is shifted up in frequency by said chopping frequency and the harmonics thereof, the energy of said low frequency noise is disposed about the harmonics of said chopping frequency, and said chopping frequency is one-half of said sampling frequency;*

*said means for transposing comprises means for chopper stabilizing said one stage of amplification at a predetermined chopping frequency, such that said low frequency noise is shifted up in frequency by said chopping frequency and the harmonics thereof, and the energy of said low frequency noise is disposed about the harmonics of said chopping frequency;*

*said one stage of amplification has an amplifier stage input and an amplifier stage output, and said one stage of amplification includes a differential amplifier having a pair of differential inputs and a pair of differential outputs;*

*said low-frequency noise is low-frequency DC offset and 1/f noise of said differential amplifier;*

*said means for chopper stabilizing includes a first electronic switching means operable periodically at said chopping frequency for alternately connecting a first one of said differential inputs to said amplifier stage input during a first half-cycle at said chopping frequency and connecting a second one of said differential inputs to said amplifier stage input during a second half-cycle at said chopping frequency, and a sec-* ond electronic switching means operable periodically at said chopping frequency for alternately connecting a first one of said differential outputs to said amplifier stage output during said first half-cycle at said chopping frequency and connecting a second one of said differential outputs to said amplifier stage output during said second half-cycle at said chopping frequency;

said digital filter is synchronized with the sampling frequency of said modulator, and said chopping frequency is synchronous with said digital filter such that the frequency-shifted low-frequency noise energy resides in one or more high attenuation regions of said digital filter, due to a periodic nature of said digital filter; and said analog modulator is operable to convert said analog input signal to a digital pulse stream, said digital pulse stream having a ones density proportional to the input signal.

24. The analog-to-digital converter as claimed in claim 7, wherein said chopping frequency is one-half of said sampling frequency.

25. The analog-to-digital converter as claimed in claim 7, wherein said one stage of amplification has an amplifier stage input and an amplifier stage output, and said one stage of amplification includes:

a differential amplifier having a pair of differential inputs and a pair of differential outputs;

a first electronic switching means operable periodically at said chopping frequency for alternately connecting a first one of said differential inputs to said amplifier stage input during a first half-cycle at said chopping frequency and connecting a second one of said differential inputs to said amplifier stage input during a second half-cycle at said chopping frequency; and a second electronic switching means operable periodically at said chopping frequency for alternately connecting a first one of said differential outputs to said amplifier stage output during said first half-cycle at said chopping frequency and connecting a second one of said differential outputs to said amplifier stage output during said second half-cycle at said chopping frequency.

26. The analog-to-digital converter as claimed in claim 7, wherein said one stage of amplification has an amplifier stage input and an amplifier stage output, and said one stage of amplification includes:

a differential amplifier having a pair of differential inputs and a pair of differential outputs;

a first electronic switch connected between said amplifier stage input and a first one of said differential inputs, and a second electronic switch connected between said amplifier stage input and a second one of said differential inputs, such that said first electronic switch and said second electronic switch are operable periodically at said chopping frequency for alternately closing a first signal path from said first one of said differential inputs to said amplifier stage input during a first half-cycle at said chopping frequency and closing a second signal path from said second one of said differential inputs to said amplifier stage input during a second half-cycle at said chopping frequency; and a third electronic switch connected between said amplifier stage output and a first one of said differential outputs, and a fourth electronic switch connected between said amplifier stage output and a second one of said differential outputs, such that said third electronic switch and said fourth electronic switch are operable periodically at said chopping frequency for alternately closing a third signal path from said first one of said differential outputs to said amplifier stage output during said first half-cycle at said chopping frequency and closing a fourth signal path from said second one of said differential outputs to said amplifier stage output during a second half-cycle at said chopping frequency.

27. The analog-to-digital converter as claimed in claim 26, wherein:

said low-frequency noise is low-frequency DC offset and 1/f noise of said differential amplifier;

said delta-sigma modulator includes at least one stage of integration that includes said one stage of amplification;

said chopping frequency is one-half of said sampling frequency; and said digital filter is synchronized with said sampling frequency.

28. The method of claim 15, wherein said chopping frequency is one-half of said sampling frequency.

29. The method of claim 15, wherein:

said one stage of amplification includes an amplifier stage input, an amplifier stage output, and a differential amplifier having a pair of differential inputs and a pair of differential outputs; and said chopper stabilizing includes operating a first set of electronic switches periodically at said chopping frequency to alternately close a first signal path from said first one of said differential inputs to said amplifier stage input during a first half-cycle at said chopping frequency and close a second signal path from said second one of said differential inputs to said amplifier stage input during a second half-cycle at said chopping frequency, and to alternately close a third signal path from said first one of said differential outputs to said amplifier stage output during said first half-cycle at said chopping frequency and close a fourth signal path from said second one of said differential outputs to said amplifier stage output during a second half-cycle at said chopping frequency.

30. The method as claimed in claim 29, wherein said low-frequency noise is low-frequency DC offset and 1/f noise of said differential amplifier, and said chopping frequency is one-half of said sampling frequency.

31. A method for converting an analog input signal to a digital signal, comprising:

passing the analog input signal through an analog modulator operating at a predetermined sampling frequency to convert the analog input signal to a digital output signal proportional to the analog input signal, the analog modulator having at least one stage of amplification, said one stage of amplification having low-frequency noise associated therewith;

filtering in the digital domain the digital output signal of the analog modulator to provide a predetermined amount of attenuation over a predetermined frequency range to reject unwanted signals;

chopper stabilizing the one stage of amplification to transpose the low-frequency noise up in frequency such that the low frequency noise is disposed about harmonics of a chopping frequency, the harmonics of the chopping frequency being disposed within the predetermined frequency range to reject unwanted frequencies; and synchronizing the chopping frequency with the sampling frequency of the analog modulator, such that the harmonics of the chopping frequency are disposed at a predetermined relationship with respect to the harmonics of the sampling frequency.

32. The method of claim 31, wherein the step of filtering comprises passing the digital output signal through a digital filter having a predefined frequency response, the frequency response of the digital filter rejects unwanted frequencies in the predetermined frequency range which comprises a high rejection portion of the frequency response, and the step of synchronizing disposes the harmonics of the chopping frequency within the high rejection portion of the frequency response.

33. The method of claim 31, wherein the analog modulator includes at least one stage of integration, and said one stage of integration includes the one stage of amplification.

34. The method of claim 31, wherein said chopping frequency is one-half of said sampling frequency.

35. The method of claim 31, wherein:

said one stage of amplification includes an amplifier stage input, an amplifier stage output, and a differential amplifier having a pair of differential inputs and a pair of differential outputs; and said chopper stabilizing includes operating a first set of electronic switches periodically at said chopping frequency to alternately close a first signal path from said first one of said differential inputs to said amplifier stage input during a first half-cycle at said chopping frequency and close a second signal path from said second one of said differential inputs to said amplifier stage input during a second half-cycle at said chopping frequency, and to alternately close a third signal path from said first one of said differential outputs to said amplifier stage output during said first half-cycle at said chopping frequency and close a fourth signal path from said second one of said differential outputs to said amplifier stage output during a second half-cycle at said chopping frequency.

36. The method as claimed in claim 35, wherein said low-frequency noise is low-frequency DC offset and 1/f noise of said differential amplifier, and said chopping frequency is one-half of said sampling frequency.

* * * * *